(12) United States Patent
Togo (10) Patent No.: US 9,508,602 B2
(45) Date of Patent: Nov. 29, 2016

(54) TEMPERATURE-CONTROLLED IMPLANTING OF A DIFFUSION-SUPPRESSING DOPANT IN A SEMICONDUCTOR STRUCTURE

(71) Applicant: GLOBALFOUNDRIES Inc., Grand Cayman (KY)

(72) Inventor: Mitsuhiro Togo, Burnt Hills, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 26 days.

(21) Appl. No.: 14/593,183

(22) Filed: Jan. 9, 2015

(65) Prior Publication Data

US 2016/0204039 A1 Jul. 14, 2016

(51) Int. Cl.
*H01L 21/324* (2006.01)
*H01L 21/8238* (2006.01)
*H01L 21/265* (2006.01)
*H01L 29/66* (2006.01)
*H01L 29/32* (2006.01)
*H01L 29/10* (2006.01)
*H01L 29/08* (2006.01)
*H01L 27/092* (2006.01)
*H01L 29/167* (2006.01)

(52) U.S. Cl.
CPC . *H01L 21/823814* (2013.01); *H01L 21/26506* (2013.01); *H01L 21/26513* (2013.01); *H01L 21/324* (2013.01); *H01L 21/823821* (2013.01); *H01L 27/0924* (2013.01); *H01L 29/0847* (2013.01); *H01L 29/1037* (2013.01); *H01L 29/1083* (2013.01); *H01L 29/1095* (2013.01); *H01L 29/167* (2013.01); *H01L 29/32* (2013.01); *H01L 29/66795* (2013.01)

(58) Field of Classification Search
CPC ............. H01L 21/8238; H01L 21/265; H01L 21/324; H01L 29/66; H01L 29/32; H01L 29/10; H01L 29/08; H01L 27/092; H01L 29/167
USPC .................................. 438/283, 232; 257/369
See application file for complete search history.

(56) References Cited

U.S. PATENT DOCUMENTS

2006/0065934 A1* 3/2006 Okayama ........ H01L 21/823835
257/365
2012/0153387 A1* 6/2012 Murthy ............. H01L 21/28512
257/335

* cited by examiner

*Primary Examiner* — Asok K Sarkar
*Assistant Examiner* — Dmitriy Yemelyanov
(74) *Attorney, Agent, or Firm* — Heslin Rothenberg Farley and Mesiti PC; Nicholas Mesiti (57) ABSTRACT

Semiconductor structures and methods of fabrication are provided for, for instance, inhibiting diffusion of active dopant within a semiconductor material. A diffusion-suppressing dopant is implanted via, an implanting process under controlled temperature, into a semiconductor material of a semiconductor structure to define a diffusion-suppressed region within the semiconductor material. One or more active regions are established within the diffusion-suppressed region of the semiconductor structure by, for example, implanting an active dopant into the semiconductor material. The implanting of the diffusion-suppressing dopant facilitates inhibiting diffusion of the active dopant within the diffusion-suppressed region.

12 Claims, 5 Drawing Sheets

FIG. 1M ized temperature-controlled implanting of a diffusion-suppressing dopant in a semiconductor structure

TEMPERATURE-CONTROLLED IMPLANTING OF A DIFFUSION-SUPPRESSING DOPANT IN A SEMICONDUCTOR STRUCTURE

BACKGROUND

Semiconductor structure, such as field-effect transistors (FETs), have conventionally been fabricated as planar circuit elements. More recently, fin-type field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a vertical structure within or upon which are formed, for instance, one or more FinFETs or other fin devices, including capacitors, diodes etc. Advantageously, the fin structure helps to control current leakage through the transistor in the off-stage, and a double-gate or tri-gate structure may be employed to control other short channel effects.

As described by Moore's Law, the semiconductor industry continues to drive down pattern dimensions in order to reduce transistor size and enhance processor speed at a rapid pace. Further enhancements in fin device structures and fabrication methods continue to be pursued for enhanced performance and commercial advantage.

BRIEF SUMMARY

Certain shortcomings of the prior art are overcome and additional advantages are provided through the provision, in one aspect, of a method which includes fabricating a semiconductor structure. The fabricating includes: implanting a diffusion-suppressing dopant under controlled temperature into a semiconductor material of the semiconductor structure, wherein the implanting facilitates defining a diffusion-suppressed region within the semiconductor material; and establishing one or more active regions within the diffusion-suppressed region of the semiconductor structure, the establishing including implanting an active dopant into the semiconductor material, and wherein the implanting of the diffusion-suppressing dopant facilitates inhibiting diffusion of the active dopant within the diffusion-suppressed region.

In another aspect, a method which includes fabricating a fin-type field-effect transistor (FinFET). The fabricating includes: implanting a diffusion-suppressing dopant under controlled temperature into a semiconductor material of the FinFET, wherein the implanting facilitates defining a diffusion-suppressed region within the semiconductor material; and establishing one or more active regions within the diffusion-suppressed region of the FinFET, the establishing including implanting an active dopant into the semiconductor material, and wherein the implanting of the diffusion-suppressing dopant facilitates inhibiting diffusion of the active dopant within the diffusion-suppressed region of the FinFET.

In yet another aspect, a device which includes a semiconductor structure. The semiconductor structure includes a diffusion-suppressed region disposed within a semiconductor material of the semiconductor structure, the diffusion-suppressed region being defined by the presence of a diffusion-suppressing dopant implanted via, a implanting process under controlled temperature, within the semiconductor material; and one or more active regions disposed within the diffusion-suppressed region of the semiconductor structure, the one or more active regions having an active dopant implanted therein, wherein the diffusion-suppressing dopant disposed within the semiconductor material facilitates inhibiting diffusion of the active dopant within the diffusion-suppressed region.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that, in making reference below to the drawings (which are not drawn to scale for ease of understanding) the same reference numbers used throughout different figures designate the same or similar components.

Disclosed herein, in part, are methods for inhibiting diffusion of one or more dopants within a semiconductor material by, for instance, minimizing interstitial defects within a crystal lattice structure of the semiconductor material. During the fabrication of semiconductor devices such as, for instance, fin-type field-effect transistor (FinFET) devices and/or planar FETs, active dopants are typically implanted into a semiconductor material via, for instance, one or more ion implantation processes resulting in establishing one or more active regions such as, for instance, well region, punch-through stop region, channel region and/or source and drain regions separated by the channel region. Several issues may arise during, for instance, the one or more ion implantation processes, which could negatively impact performance or yield of integrated circuit containing, for instance, fin-type field-effect transistors (FinFETs).

By way of example, one or more active regions may be established by implanting one or more active dopants within the fin structures or fin(s) via, for instance, a high temperature ion implantation process through an upper surface of the fin(s), followed by high temperature annealing process with parameters selected to facilitate forming one or more desired active regions within the fin(s) which, for instance, may extend into the semiconductor substrate. Although in one aspect, a diffusion-suppressing dopant may also be co-implanted along with the active dopants within the fin(s) during the high temperature ion implantation process, the process parameters employed could disadvantageously result in damaging crystal lattice structure of the semiconductor material of the fin(s) and/or semiconductor substrate, and resulting in the implanted active dopants (in one example, along with the diffusion-suppressing dopant) being weakly bound to the semiconductor material. Upon performing a high temperature thermal anneal process, the crystal lattice structure of the semiconductor material may be further adjusted to position the active dopants (for example, along with the diffusion-suppressing dopant) further into the crystal lattice structure of the semiconductor material, thereby stabilizing the active dopants and the diffusion-suppressing dopant within the semiconductor material. However, the elevated temperatures employed during the thermal anneal process often may not activate the diffusion-suppressing dopant so as to inhibit or prevent an undesirable distribution and/or diffusion of the active dopants creating self-interstitial point defects or vacancies within the resultant semiconductor devices such as, FinFET devices. This diffusion of the active dopants, often referred to as transient-enhanced diffusion (TED), could result in affecting a junction depth of the resultant device(s). Additionally, the transient-enhanced diffusion (TED) could also cause an undesirable lateral diffusion of the active dopants which may result in minimizing or reducing, for instance, a length of the channel region. This, in turn, could cause undesirable leakage current within the semiconductor device, resulting in performance degradation of the resultant FinFET devices.

To overcome these issues, disclosed herein below, in one aspect, is an enhanced method for inhibiting diffusion of one or more dopants within a semiconductor material by, for example, minimizing interstitial defects within a crystal lattice structure of the semiconductor material, for example, during the fabrication of a semiconductor structure. The method includes, for example: implanting a diffusion-suppressing dopant under controlled temperature into a semiconductor material of the semiconductor structure, where the implanting facilitates defining a diffusion-suppressed region within the semiconductor material; and establishing one or more active regions within the diffusion-suppressed region of the semiconductor structure, the establishing including implanting an active dopant into the semiconductor material, and where the implanting of the diffusion-suppressing dopant facilitates inhibiting diffusion of the active dopant within the diffusion-suppressed region. By way of example, the implanting of the active dopant, subsequent to the implanting of the diffusion-suppressing dopant under controlled temperature facilitates inhibiting or minimizing interstitial defects within the crystal lattice structure of the semiconductor material, thereby preventing transient-enhanced diffusion of the active dopants.

By way of example, the implanting may include implanting the diffusion-suppressing dopant at a controlled process temperature selected to facilitate minimizing interstitial defects within a crystal lattice structure of the semiconductor material. The implanting may further include, performing an annealing process, subsequent to the implanting of the diffusion-suppressing dopant into the semiconductor material, the annealing process facilitating stabilizing the diffusion-suppressed region within the semiconductor material. In one example, the implanting may include implanting the diffusion-suppressing dopant with an implantation energy, while controlling a process temperature, which defines a depth of the diffusion-suppressed region at a desired depth within the semiconductor material.

In one embodiment, the establishing may include establishing at least one of a well region, a punch-through stop region, a channel region or a source and drain region separated by the channel region within the semiconductor material. For instance, the fabricating may include implanting the diffusion-suppressing dopant into the semiconductor material with a first implantation energy, and implanting the active dopant into the semiconductor material with a second implantation energy, the first implantation energy being higher than the second implantation energy.

By way of example, the diffusion-suppressing dopant may include a first diffusion-suppressing dopant, and the one or more active regions may include a channel region of the semiconductor structure, the channel region extending, at least partially, into a first diffusion-suppressed region within the semiconductor material of a substrate. The fabricating may further include providing a gate structure over the channel region of the semiconductor structure; implanting of a second diffusion-suppressing dopant under controlled temperature into the semiconductor material of a fin structure extending above the substrate, where the implanting facilitates defining a second diffusion-suppressed region, the second diffusion-suppressed region being outside of the channel region and extending, at least partially, into the first diffusion-suppressed region; and establishing a source and drain region within the second diffusion-suppressed region of the fin structure. By way of example, the channel region of the semiconductor structure may include a channel dopant material, and the establishing the source and drain region may include implanting a source and drain dopant material into the semiconductor material, with the channel dopant material and the source and drain dopant material being different dopant materials. The diffusion-suppressing dopant may include a first dopant material, and the active dopant may include a second dopant material, the first dopant material and the second dopant material being different dopant materials. For instance, the first dopant material may include at least one of germanium, carbon, fluorine or nitrogen, and the second dopant material may include at least one of an n-type dopant such as, for example, phosphorus, antimony or arsenic or a p-type dopant such as, for example, boron, aluminum, gallium or indium.

In another embodiment, the method may also include fabricating a fin-type field-effect transistor (FinFET). The fabricating may include: implanting a diffusion-suppressing dopant under controlled temperature into a semiconductor material of the FinFET, where the implanting facilitates defining a diffusion-suppressed region within the semiconductor material; and establishing one or more active regions within the diffusion-suppressed region of the FinFET, the establishing including implanting an active dopant into the semiconductor material, and where the implanting of the diffusion-suppressing dopant facilitates inhibiting diffusion of the active dopant within the diffusion-suppressed region of the FinFET. In one embodiment, the diffusion-suppressing dopant comprises a first diffusion-suppressing dopant and a second diffusion-suppressing dopant, and the implanting includes implanting the first diffusion-suppressing dopant under controlled temperature into a substrate of the FinFET, and the method further includes implanting the second diffusion-suppressing dopant under controlled temperature into a fin structure extending above the substrate of the FinFET. By way of example, the FinFET may include an n-type FinFET and a p-type FinFET, and the method may include: non-selectively, implanting of the diffusion-suppressing dopant under controlled temperature into the semiconductor material of the n-type FinFET and the p-type FinFET, where the non-selectively, implanting facilitates defining the diffusion-suppressed region within the semiconductor material; and subsequent to the implanting, establishing one or more active regions by selectively implanting the active dopant into the semiconductor material, the selectively implanting of the active dopant facilitates forming of the n-type FinFET and the p-type FinFET.

In another aspect, a device is disclosed which includes a semiconductor structure, with a diffusion-suppressed region disposed within a semiconductor material of the semiconductor structure, the diffusion-suppressed region being defined by the presence of a diffusion-suppressing dopant implanted via, an implanting process under controlled temperature, within the semiconductor material; and one or more active regions disposed within the diffusion-suppressed region of the semiconductor structure, the one or more active regions having an active dopant implanted, the diffusion-suppressing dopant disposed within the semiconductor material facilitates inhibiting diffusion of the active dopant within the diffusion-suppressed region. By way of example, the diffusion-suppressed region within the semiconductor material has a desired depth relative to a depth of the active region, the relative desired depth being within a range of about 5 to 10%.

FIGS. 1A-1M depicts an example of an enhanced method for fabricating a fin-type field effect transistor. Advantageously, as described below, the implanting of the diffusion-suppressing dopant under controlled temperature facilitates inhibiting diffusion, in particular, transient-enhanced diffusion of active dopants during subsequent implantation processes, in accordance with one or more aspects of the present invention.

Figure 1A:
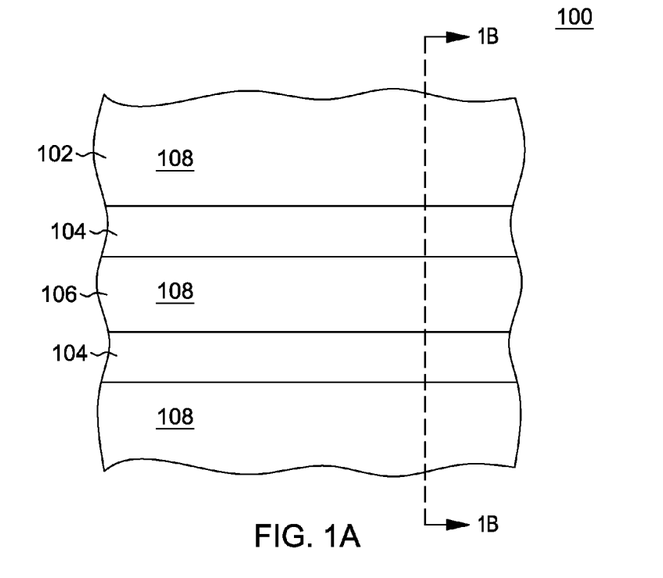
FIG. 1A depicts a plan-view of one embodiment of an intermediate structure obtained during a semiconductor fabrication process, in accordance with one or more aspects of the present invention.

FIG. 1A depicts a plan-view of one embodiment of an intermediate structure 100 obtained during a semiconductor fabrication process, in accordance with one or more aspects of the present invention. By way of overall context, in one example, substrate 102 may include one or more fin structures 104 which support the formation of fin-type field-effect transistors (FinFETs) and planar FETs. As depicted, in one example, fin(s) 104 may be separated by creating openings 106 and subsequently filling the openings with an isolation material 108, so as to isolate the fin(s) and the device elements formed therein from one another.

Figure 1B:
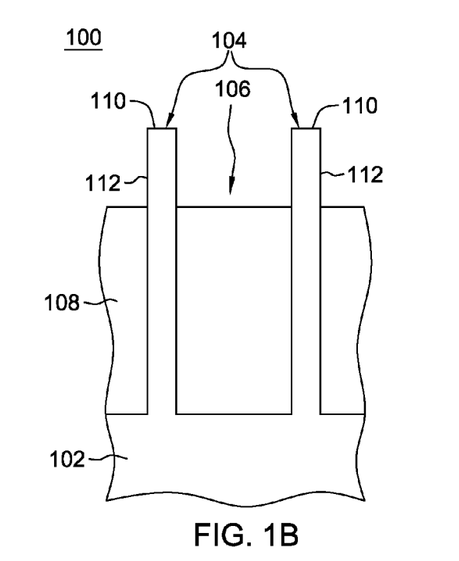
FIG. 1B is a partial cross-sectional elevational view of a structure of FIG. 1A, taken along line 1B-1B thereof, illustrating one or more fins associated with the structure, in accordance with one or more aspects of the present invention.

FIG. 1B illustrates a partial cross-sectional elevational view of the structure of FIG. 1A, taken along line 1B-1B thereof. In the illustrated example, structure 100 includes a substrate 102, such as a semiconductor substrate. For example, substrate 102 may be a bulk semiconductor material such as a bulk silicon wafer. As another example, substrate 102 may include or be a silicon-containing substrate including, but not limited to, silicon (Si), single crystal Si, polycrystalline Si, amorphous Si, silicon-on-nothing (SON), silicon-on-insulator (SOI), or silicon-on-replacement insulator (SRI) substrate or the like. Substrate 102 may in addition or instead include various isolations, dopings and/or device features. For instance, substrate 102 may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb).

One or more fins 104 are formed extending from substrate 102. By way of example, fins 104 may be formed by removing one or more portions of substrate 102, creating openings 106 therein, to define one or more fins 104 from the same material as the substrate, such as, for example, a silicon semiconductor material. In one example, formation of fins 104 may be achieved by patterning the substrate 102 using any of various approaches, including: direct lithography; sidewall image transfer technique; extreme ultraviolet technique (EUV); e-beam technique; litho-etch litho-etch; or litho-etch litho-freeze. Following patterning, the removal may be performed by any suitable etching process, such as an anisotropic dry etching process, for instance, reactive-ion-etching (RIE) in sulfur hexafluoride (SF$_6$). In one example, adjacent fins 104 may be separated by a respective opening 106.

Continuing with FIG. 1B, the space between fins 104 may be filled with an isolation material 108. Isolation material 108, in one example, may be or include a dielectric material, and may be deposited using a variety of techniques such as, for example, chemical vapor deposition (CVD), plasma-enhanced CVD or sub-atmospheric pressure thermal CVD (SACVD) processes. The thickness of isolation material 108 may be (in one example) sufficient to allow subsequent planarization of the structure, for instance, to expose an upper surface of the protective material over the fins. By way of example, isolation material 108 may be fabricated of or include an oxide material. For instance, high-density plasma (HDP) oxide, high aspect ratio process (HARP) oxide or tetraethyl orthosilicate (TEOS)-based silicon dioxide may be deposited as isolation material 108, using a plasma-enhanced CVD process. As a specific example, a chemical vapor deposition process may be employed using tetraethyl orthosilicate (TEOS) and ozone (O$_3$) as reactants to deposit a tetraethyl orthosilicate based silicon dioxide isolation material in the spaces between fins 104, which will serve to electrically isolate the resultant fin-type field effect transistors.

Continuing further with FIG. 1B, one or more selective etch processes have been performed to recess isolation material 108, for instance, down from upper surfaces 110 of fins 104, in accordance with one or more aspects of the present invention. By way of example, isolation material 108 may be selectively etched using one or more isotropic or anisotropic dry etching processes such as, reactive ion etching or plasma etching, and is etched to expose one or more sidewalls 112 of fins 104. Note that, as further discussed below, in one embodiment, the isolation material 108 is recessed down from upper surfaces 110 for approximately a depth of the channel region within the fins.

Figure 1C:
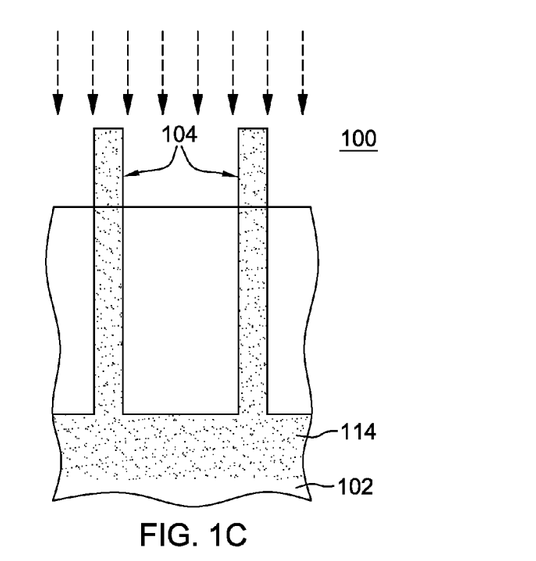
FIG. 1C depicts the structure of FIG. 1B, with a diffusion-suppressing dopant implanted via, for instance, an implanting process under controlled temperature, into fin(s) and extending into a substrate, in accordance with one or more aspects of the present invention.

As depicted in FIG. 1C, the semiconductor material of structure 100 may be implanted with a diffusion-suppressing dopant, for instance, through fin(s) 104 via, for instance, a temperature-controlled implanting process, to form a diffusion-suppressed region 114 within substrate 102. By way of example, the diffusion-suppressing dopant may include or be fabricated of an electrically inactive dopant such as, for instance, germanium, fluorine, carbon or nitrogen. In one embodiment, the diffusion-suppressed region 114 within the fins 104 and extending into substrate 102 may be designed to, for instance, inhibit diffusion of one or more active dopants implanted during any one of the subsequent ion implantation processes. For instance, the diffusion-suppressing dopant may be implanted non-selectively into fins 104 via, for instance, an ion implantation process employing controlled process parameters such as, for example, process temperature, implantation energy, implantation dose and/or implantation angle, so as to facilitate minimizing or preventing undesirable pre-amorphization damage within the semiconductor material. In one specific example, the non-selective ion implantation process may be accomplished either by selecting the process temperature to be above a room temperature, and in particular, within a range of about 300° C. to 700° C., so as to facilitate minimizing the interstitial defects within the crystal lattice structure of the semiconductor material. In another specific example, the non-selective ion implantation process may be accomplished by selecting the process temperature to be below the room temperature, and in particular, within a range of about −20° C. to −100° C.

By way of example, fin(s) 104 may be implanted with a diffusion-suppressing dopant such as, for instance, germanium or a compound of germanium (for instance, germane (GeH$_4$)), employing an implantation dose of about 5e14 to 1e15 atom/cm$^2$, with an implantation energy of about 12 to 30 keV and at a temperature within a range of about 300 to 700° C., to provide a concentration of germanium within fins 104 and extending into substrate 102. For instance, the concentration of germanium ions implanted within fins 104 may be in the range of about 5e19 to 1e21 atom/cm$^3$. In another example, fin(s) 104 may be implanted with a diffusion-suppressing dopant such as, for instance, fluorine or a compound of fluorine (for instance, nitrogen trifluoride (NF$_3$)), employing an implantation dose of about 5e14 to 2e15 atom/cm$^2$, with an implantation energy of about 5 to 10 keV and at a temperature within a range of about 300 to 700° C., to provide a concentration of fluorine within fins 104 and extending into substrate 102. In a third example, fin(s) 104 may be implanted with a diffusion-suppressing dopant such as, for instance, nitrogen or a compound of nitrogen, employing an implantation dose of about 1e15 atom/cm$^2$, with an implantation energy of about 7 keV, and at a temperature within a range of about −20° C. to −100° C., to provide a concentration of nitrogen within fins 104 and extending into substrate 102. In a fourth example, the fin(s) may be implanted with a diffusion-suppressing dopant such as, for example, carbon or a compound of carbon, employing an implantation dose of about 1e15 to 3e15 atom/cm$^2$, with an implantation energy of about 4 to 10 keV and at a temperature within a range of about −20° C. to −100° C. or about 300 to 700° C., to provide a concentration of carbon within fins 104 and extending into substrate 102. In fifth example, the fin(s) may be implanted with a diffusion-suppressing dopant such as, for example, germanium or a compound of germanium along with fluorine or a compound of fluorine, to provide appropriate concentrations of germanium and fluorine diffusion-suppressing dopants within fins 104 and extending into substrate 102. In this example, germanium may be implanted, for instance, employing an implantation dose of about 5e14 atom/cm$^2$, with an implantation energy of about 12 to 30 keV, while the fluorine may be implanted, for instance, employing an implantation dose of about 5e14 to 2e25 atom/cm$^2$, with an implantation energy of about 10 keV, at a temperature within a range of about −20° C. to −100° C. or about 300 to 700° C.

In another example, the diffusion-suppressing dopant(s) may also be implanted into the semiconductor material of fin(s) 104 with an implantation energy which facilitates controlling depth of diffusion-suppressed region 114 within fins 104, extending into the substrate. Such controlling of implantation energy, while also controlling a process temperature advantageously facilitates controlling depth of the diffusion-suppressed region 114 within substrate 102 which, in one example, may be within a range of about 10 to 40 nm.

Continuing with FIG. 1C, structure 100 may be subjected to an annealing process to facilitate stabilizing the diffusion-suppressing dopant(s) within the diffusion-suppressed region 114, to facilitate achieving a desired configuration and distribution of the diffusion-suppressing dopants within diffusion-suppressed region 114. The crystal lattice structure of the silicon fin material, for instance, may be altered during the ion (i.e., diffusion-suppressing dopant) implantation process, resulting in the implanted diffusion-suppressing dopant being weakly bound to the silicon fin material. Upon performing a high temperature annealing process, the crystal lattice structure of the silicon fin material may be adjusted to better position the diffusion-suppressing dopant into the crystal lattice structure of the silicon fin material, thereby stabilizing the diffusion-suppressing dopant within the silicon fin material. The high temperature annealing process may be performed using, for instance, a spike annealing, laser annealing, rapid thermal annealing (RTA), flash annealing or the like. In one example, the annealing process may be performed using rapid thermal annealing process at an elevated temperature of about 950° C. to 1100° C. in the presence of inert gas such as, Argon (Ar), at about atmospheric pressure.

Figure 1D:
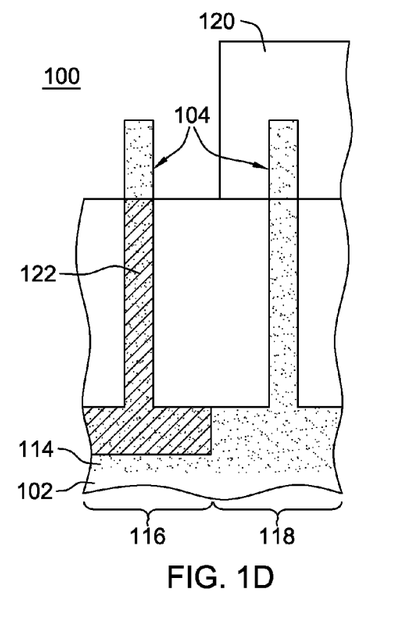
FIG. 1D depicts the structure of FIG. 1C, after exposing a first region of the fin(s), while overlying a second region of the fin(s) with a protective layer to, for instance, facilitate selectively implanting an active dopant within the first region of the fin(s), in accordance with one or more aspects of the present invention.

FIG. 1D depicts the structure of FIG. 1C, after exposing a first region 116 of the fin(s) 104, while overlying a second region 118 of the fin(s) 104 with a protective layer 120, for instance, to facilitate selectively implanting an active dopant within the first region 116 of the fin(s). This protective layer 120 protects the structure of second fin region 118 from ion implantation processing to be subsequently performed within the first fin region 116. In one embodiment, protective layer 120 may include or be fabricated of a material such as, for instance, a photoresist material. In a specific example, protective photoresist layer may include, for instance, organic photoresist materials, non-organic materials or combinations thereof. In another example, where no high temperature processes are involved, ODL and FCVD masking may also be used.

Continuing with FIG. 1D, first fin region 116, and in particular, diffusion-suppressed region 114 (see FIG. 1C) of the first fin region 116, may be implanted with an active dopant to form an active region 122. By way of example, the active dopant being implanted into the first fin region 116 may be or include a p-type dopant so as to facilitate forming, for example, a well region within exposed first fin region 116. As used herein, p-type dopant refers to the addition of an impurity to the exposed first fin region 116 (comprising, for instance, an intrinsic semiconductor material) to create deficiencies of valence electrons. Examples of a p-type dopant may include boron, aluminum, gallium or indium, any one or more of which may be added to first fin region 116 including, for instance, silicon material. In one example, the exposed first fin region 116 may be implanted with, for instance, a p-type active dopant such as, for instance, boron or a compound of boron (for instance, boron trifluoride ($BF_3$), octadecaborane ($B_{18}H_{22}$)), by employing an implantation dose of about 5e12 to 3e13 atom/$cm^2$, with an implantation energy of about 10 to 15 keV, to provide a desired concentration of p-type active well dopant within the exposed first fin region 116 of fin(s) 104. In such an example, the concentration of p-type active well dopants implanted within fins 104 may be in the range of about 5 e18 to 3e19 atom/$cm^3$.

In one embodiment, first region 116 of the fin(s) 104, and in particular, diffusion-suppressed region 114 (see FIG. 1C) of the first region 116, has been implanted with the active well dopant via, for instance, an ion implantation process employing process parameters such as, for example, implantation energy and/or implantation dose, so as to facilitate implanting only a portion of the diffusion-suppressed region 114 (FIG. 1C), as illustrated. Additionally, the implantation energy employed during the ion implantation process may be selected and configured to facilitate extending the active well dopant into substrate 102 so as to define a depth of the active well region within the diffusion-suppressed region 114 of substrate 102. For instance, the depth of the active well region 122, in one example, may be equal or substantially be less than a depth of the diffusion-suppressed region 114. In another example, the active region within the semiconductor material has a desired depth relative to a depth of the diffusion-suppressed region, which may within a range of about 5 to 10%. As discussed above, the implantation energy of the diffusion-suppressing dopant may be substantially higher than the implantation energy of the active dopant.

Figure 1E:
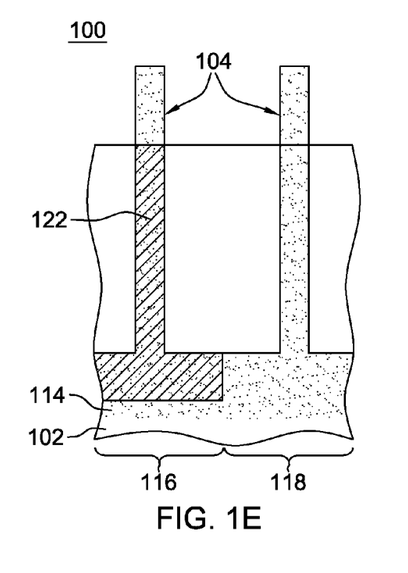
FIG. 1E depicts the structure of FIG. 1D, after removal of the protective layer, in accordance with one or more aspects of the present invention.

As depicted in FIG. 1E, protective layer 120 (see FIG. 1D) disposed over the second region 118 of the fins(s) 104 may be removed. Protective layer 120 may be selectively removed by employing one or more dry etching processes involving reactive oxygen, such as, for instance, oxygen plasma in an ashing environment. In another example, the ashing environment may also include water vapor and a gaseous fluorocarbon or a fluorinated hydrocarbon gas.

Figure 1F:
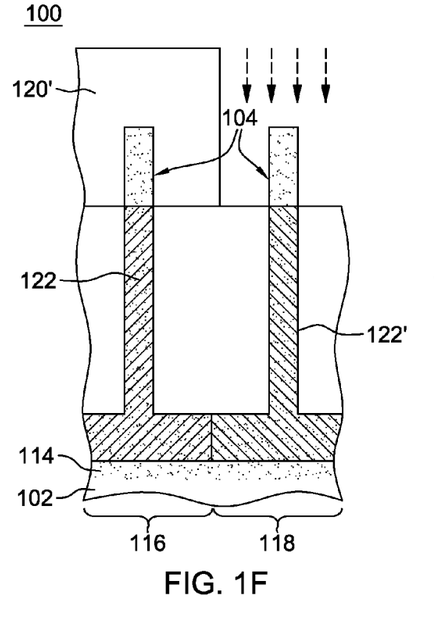
FIG. 1F depicts the structure of FIG. 1E, after providing a protective layer over a first fin region of the structure, in accordance with one or more aspects of the present invention.

FIG. 1F illustrates the structure of FIG. 1E with a further protective layer 120' having been provided over the first fin region 116 to, for instance, facilitate selectively implanting an active dopant within the exposed second region 118 of the fin(s), in accordance with one or more aspects of the present invention. Additional protective layer 120' may be provided using any of the techniques described above with regard to the protective layer 120 (FIG. 1D) provided over the second region 118. Note that, in another example, and depending on the process steps involved, second fin region 118 may be implanted simultaneously with the first fin region 116, obviating the need for a second implanting step using additional protective layer 120'.

Continuing with FIG. 1F, exposed second fin region 118, and in particular, diffusion-suppressed region 114 of the exposed second region 118, may be implanted with an active dopant to form an active region 122'. By way of example, the active dopant being implanted into the second fin region 118 may be or include an n-type dopant so as to facilitate forming, for example, a well region within exposed second fin region 118. As used herein, an n-type dopant refers to the addition of impurities to the second fin region 118 (comprising, for instance, an intrinsic semiconductor material), which contributes more electrons to the intrinsic material, and may include (for instance) phosphorus, antimony or arsenic. In one example, the second fin region 118 may be implanted with, for instance, an n-type active dopant such as, for instance, phosphorus or a compound of phosphorus (for instance, heptaphosphane ($P_7H_3$)), by employing an implantation dose of about 5e12 to 3e13 atom/$cm^2$, with an implantation energy of about 30 to 50 keV, to provide a desired concentration of n-type well dopant within the second fin region 118. In such an example, the concentration of n-type active well dopants implanted within fins 104 may be in the range of about 5e18 to 3e19 atom/$cm^3$.

In one embodiment, exposed second region 118, and in particular, diffusion-suppressed region 114 of the exposed second region 118, has been implanted with the active well dopant via, for instance, an ion implantation process employing process parameters such as, for example, implantation energy and/or implantation dose, so as to facilitate implanting only a portion of the diffusion-suppressed region 114, as illustrated. Additionally, the implantation energy employed during the ion implantation process may be selected and configured to facilitate extending the active well dopant into substrate 102 so as to define a depth of the active well region within the diffusion-suppressed region 114 of substrate 102. For instance, the depth of the active well region 122', in one example, may be equal or substantially be less than a depth of the diffusion-suppressed region 114. In another example, the active well region within the semiconductor material has a desired depth relative to a depth of the diffusion-suppressed region which may be being within a range of about 5 to 10%. As discussed above, the implantation energy of the diffusion-suppressing dopant may be substantially higher than the implantation energy of the active well dopant.

Figure 1G:
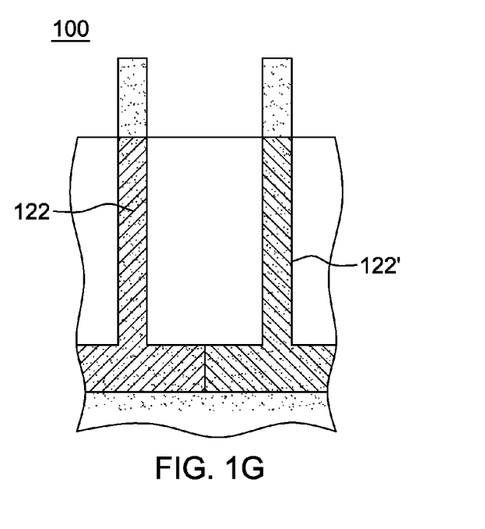
FIG. 1G depicts the structure of FIG. 1F, with one or more active regions having been established and subsequently, removing the protective layer from the first fin region thereof, in accordance with one or more aspects of the present invention.

As depicted in FIG. 1G, structure 100 may optionally be subjected to an annealing process to facilitate diffusing of the active dopant within the first fin region 116 and second fin region 118, and in particular, the diffusion-suppressed region 114 of the first and second fin regions, to achieve a desired configuration and distribution of the active well dopant within active well regions 122 and 122' of first fin region 116 and second fin region 118, respectively, and extending into substrate 102. The crystal lattice structure of the silicon fin material, for instance, may be altered during the ion (i.e., active dopant) implantation process, resulting in the implanted active well dopant being weakly bound to the silicon fin material. Upon performing a high temperature annealing process, the crystal lattice structure of the silicon fin material may be adjusted to better position the active dopant into the crystal lattice structure of the silicon fin material, thereby stabilizing the active dopant within the silicon fin material. The high temperature annealing process may be performed using, for instance, a spike annealing, laser annealing, rapid thermal annealing (RTA), flash annealing or the like. In one example, this annealing process may be performed using rapid thermal annealing process at an elevated temperature of about 950° C. to 1100° C. in the presence of inert gas such as, Argon (Ar), having an atmospheric pressure.

As discussed above, this p-type active well region 122 of first fin region 116 facilitates defining n-type transistor such as, for instance, n-type fin-field-effect transistor (n-type FinFET), while n-type active well region 122' of the second fin region 118 defines p-type transistor such as, for instance, p-type fin-field-effect transistor (p-type FinFET), in accordance with one or more aspects of the present invention. In another embodiment, the active regions 122 and 122' of first fin region 116 and second fin region 118, respectively, may include at least one of a channel region disposed within the fin(s), a punch-through stop region which facilitates reducing punch-through leakage current in a portion of the fin not covered by a gate structure, but below the channel region, depending on the fabrication processing technique being employed The diffusion-suppressed dopant disposed within the diffusion-suppression region advantageously facilitates in minimizing or preventing undesirable distribution and/or diffusion of the n-type and p-type active dopants beyond the intended active region during the ion implantation process. Additionally, the diffusion-suppressing dopant of the diffusion-suppressed region advantageously facilitates in minimizing or inhibiting lateral or longitudinal diffusion of the active dopants, for instance, beyond the diffusion-suppressed region. This minimizing of the lateral diffusion (often referred to as lateral straggle) or longitudinal diffusion (also referred to as longitudinal straggle) advantageously facilitates controlling location of the active region(s), thereby suppressing transient-enhanced diffusion (TED) of the active dopants.

Continuing with FIG. 1G, protective layer 120' (see FIG. 1F) disposed over the first region 116 of the fins(s) 104 may be subsequently removed, in accordance with one or more aspects of the present invention. Additional protective layer 120' may be removed using any of the techniques described above with regard to the protective layer 120 (FIG. 1D), as discussed above in connection with FIG. 1E.

Figure 1H:
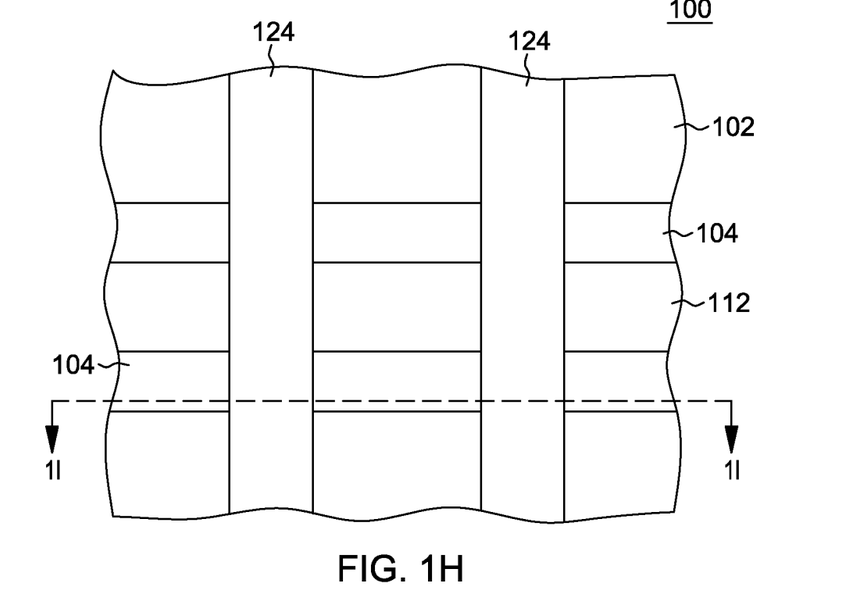
FIG. 1H depicts the structure of FIG. 1G, with one or more gate structures having been provided over the fin(s), in accordance with one or more aspects of the present invention

FIG. 1H is a plan-view of the structure of FIG. 1G, after disposing one or more gate structures 124 over the fin(s). By way of example, gate structure(s) 124 may extend conformally over (and partially wrap around) the fin(s) 104. In one example, a replacement gate process may be employed, where a sacrificial gate of an appropriate material, such as polycrystalline silicon (polysilicon), may be provided at an early stage of circuit fabrication, and then later removed and replaced with a final gate structure. In another example, the gate structure may be formed directly without the use of a sacrificial gate. In either gate process, the gate structure may be formed either before (gate-first) or after (gate-last) the formation of a source region and a drain region of field-effect transistors, depending upon the process flow selected.

Figure 1I:
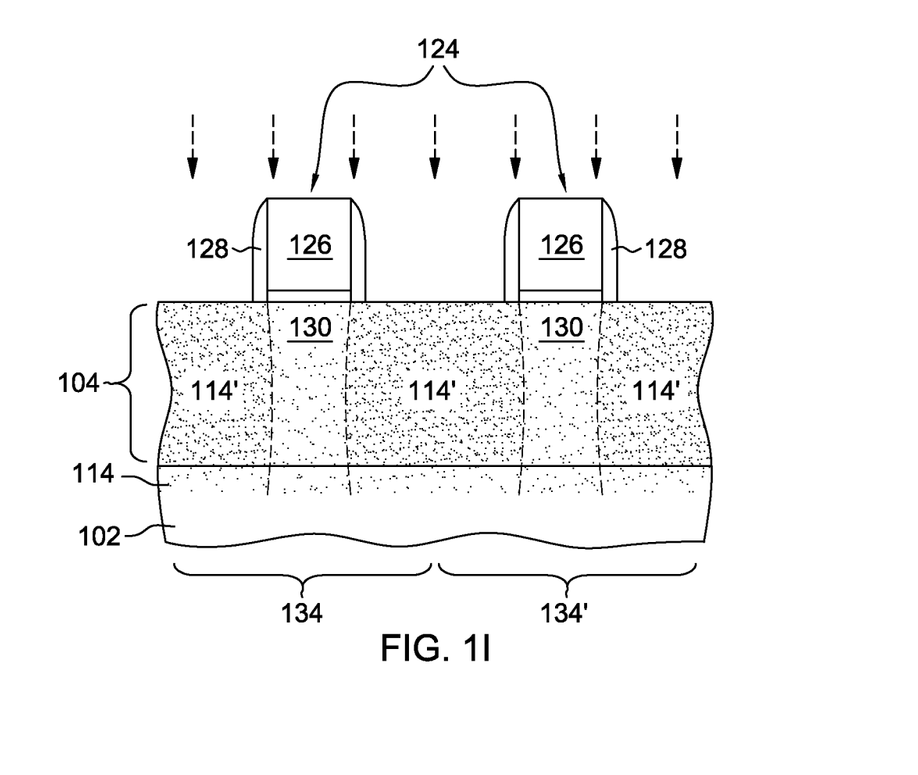
FIG. 1I depicts the structure of FIG. 1H, taken along line 1I-1I thereof and subsequently, implanting a second diffusion-suppressing dopant into the fin(s) under controlled temperature, in accordance with one or more aspects of the present invention.

As noted, FIG. 1I illustrates the structure of FIG. 1H, taken along line 1I-1I thereof. Although, as discussed above, gate structures 124 may extend conformally over (and partially wrap around) the fin(s) 104, gate structures 124 depicted herein are shown to be independent of each other, for ease of understanding. In this embodiment, gate structure(s) 124 overlay a channel region 130 of the fin(s) and that, as discussed above, the channel region has been implanted with either n-type dopant or a p-type dopant, depending on the semiconductor fabrication processing being employed. As discussed above, gate structure 124 may be a sacrificial gate structure for use in a gate-last process, in which gate structures are provided after establishment of the source region and the drain region of the semiconductor structure. In one embodiment, gate structure 124 includes, by way of example only, a sacrificial gate material 126 (such as polysilicon), and sidewall spacers 128 (formed, for example, from an oxide material). If desired, a gate cap (not shown) may be provided over sacrificial gate material 126. In another embodiment, gate structure 124 could be a gate structure of a typical gate-first process, in which gate structures are provided before establishment of the source and drain regions of the transistor. In such a case, the sacrificial gate material would be replaced by one or more gate metals disposed above a gate dielectric, both of which may be surrounded or protected by sidewall spacers 126. In this embodiment, isolation material 108 may be disposed adjacent to channel region 130 of the fin(s).

Continuing with FIG. 1I, the semiconductor material of fin(s) 104, for instance, underlying gate structure(s) 124, may be implanted with a diffusion-suppressing dopant via, for instance, a temperature-controlled implanting process, to form a diffusion-suppressed region 114' within fin(s) 104. By way of example, the diffusion-suppressing dopant may include or be fabricated of an electrically inactive dopant such as, for instance, germanium, fluorine, carbon or nitrogen. In one embodiment, the diffusion-suppressed region 114' may be disposed within the silicon fin material, and extend, at least partially into the first diffusion-suppressed region 114 of substrate 102. In one example, the diffusion-suppressed region 114' may be disposed outside of the channel region 130, due to gate structure(s) 124 being disposed over the channel region. Additionally, this diffusion-suppressed region 114' may be designed to, for instance, inhibit diffusion of one or more active dopants, for instance, source and drain dopants to be implanted during any one of the subsequent ion implantation processes. For instance, the diffusion-suppressing dopant may be implanted non-selectively into the fin material via, for instance, an ion implantation process employing controlled process parameters such as, for example, process temperature, implantation energy, implantation dose and/or implantation angle, so as to facilitate minimizing or preventing undesirable pre-amorphization damage within the silicon fin material, during the subsequent source and drain region fabrication processing.

By way of example, the non-selective ion implantation process may be accomplished either by selecting the process temperature to be above a room temperature, and in particular, within a range of about 300 to 700° C., so as to facilitate minimizing the interstitial defects within the crystal lattice structure of the silicon fin material. In another example, the non-selective ion implantation process may also be accomplished by selecting the process temperature to be below the room temperature, and in particular, within a range of about −20° C. to −100° C.

By way of example, the semiconductor material of fin(s) 104 may be implanted with a diffusion-suppressing dopant such as, for instance, germanium or a compound of germanium (for instance, germane ($GeH_4$)), employing an implantation dose of about 5e14 to 1e15 atom/$cm^2$, with an implantation energy of about 12 to 30 keV and at a temperature within a range of about 300 to 700° C., to provide a concentration of germanium within the silicon fin material. For instance, the concentration of germanium ions implanted within silicon fin material may be in the range of about 5e19 to 1e21 atom/$cm^3$. In another example, the fin(s) 104 may be implanted with a diffusion-suppressing dopant such as, for instance, fluorine or a compound of fluorine (for instance, nitrogen trifluoride ($NF_3$)), employing an implantation dose of about 5e14 to 2e15 atom/$cm^2$, with an implantation energy of about 5 to 10 keV and at a temperature within a range of about 300 to 700° C., to provide a concentration of fluorine within the silicon fin material. In a third example, fin(s) 104 may be implanted with a diffusion-suppressing dopant such as, for instance, nitrogen or a compound of nitrogen, employing an implantation dose of about 1e15 atom/$cm^2$, with an implantation energy of about 7 keV, and at a temperature within a range of about −20° C. to −100° C., to provide a concentration of nitrogen within the silicon fin material. In a fourth example, the fin(s) may be implanted with a diffusion-suppressing dopant such as, for example, carbon or a compound of carbon, employing an implantation dose of about 1e15 to 3e15 atom/$cm^2$, with an implantation energy of about 4 to 10 keV and at a temperature within a range of about −20° C. to −100° C. or about 300 to 700° C., to provide a concentration of carbon within the silicon fin material. In fifth example, the fin(s) 104 may be implanted with a diffusion-suppressing dopant such as, for example, germanium or a compound of germanium along with fluorine or a compound of fluorine, to provide appropriate concentrations of germanium and fluorine diffusion-suppressing dopants within the silicon fin material. In this example, germanium may be implanted, for instance, employing an implantation dose of about 5e14 atom/$cm^2$, with an implantation energy of about 12 to 30 keV, while the fluorine may be implanted, for instance, employing an implantation dose of about 5e14 to 2e25 atom/$cm^2$, with an implantation energy of about 10 keV, at a temperature within a range of about −20° C. to −100° C. or about 300 to 700° C.

In another example, the diffusion-suppressing dopant(s) may also be implanted into the silicon fin material with an implantation energy, while also controlling a process temperature may advantageously facilitate controlling depth of diffusion-suppressed region 114' within the silicon fin material. For instance, the depth of the diffusion-suppressed region 114' may be within a range of about 10 to 40 nm.

Continuing further with FIG. 1I, structure 100 may optionally be subjected to an annealing process to facilitate stabilizing the diffusion-suppressing dopant(s) within the diffusion-suppressed region 114', to facilitate achieving a desired configuration and distribution of the diffusion-suppressing dopants within diffusion-suppressed region 114'. Note that, the crystal lattice structure of the silicon fin material, for instance, may be altered during the ion (i.e., diffusion-suppressing dopant) implantation process, resulting in the implanted diffusion-suppressing dopant being weakly bound to the silicon fin material. Upon performing a high temperature annealing process, the crystal lattice structure of the silicon fin material may be adjusted to better position the diffusion-suppressing dopant into the crystal lattice structure of the fin(s), thereby stabilizing the diffusion-suppressing dopant within the silicon fin material. The high temperature annealing process may be performed using, for instance, a spike annealing, laser annealing, rapid thermal annealing (RTA), flash annealing or the like. In one example, the annealing process may be performed using rapid thermal annealing process at an elevated temperature of about 950° C. to 1100° C. in the presence of inert gas such as, Argon (Ar), at atmospheric pressure.

Figure 1J:
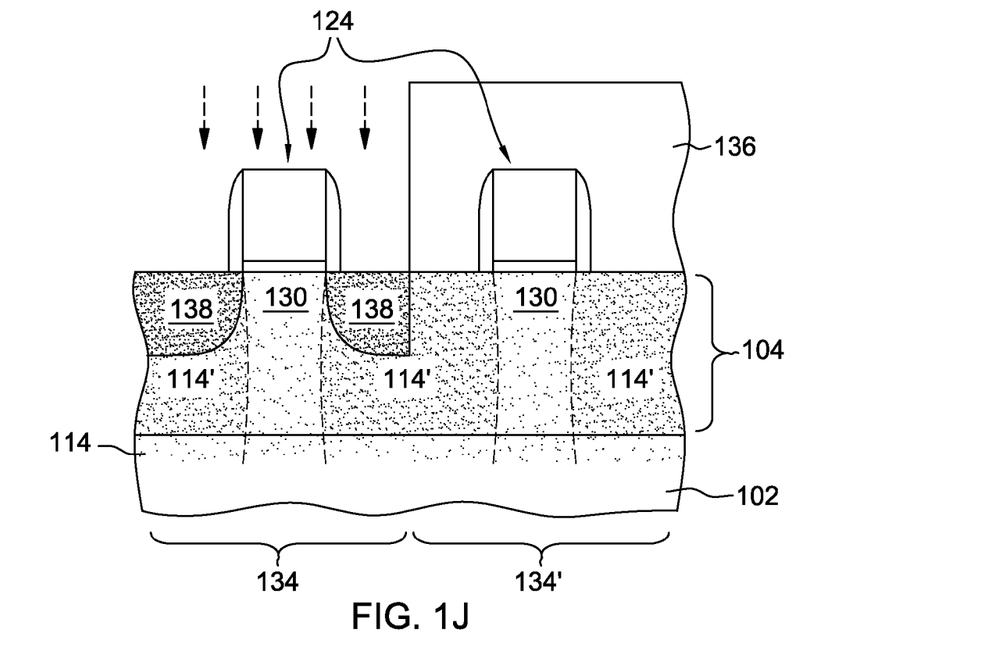
FIG. 1J depicts the structure of FIG. 1I, after exposing a first region of the fin(s), while overlying a second region of the fin with a protective layer to, for instance, facilitate selectively implanting an active dopant within the first region thereof, in accordance with one or more aspects of the present invention.

FIG. 1J depicts the structure of FIG. 1I, after exposing a first region 134 of fin(s) 104, while overlying a second region 134' with a protective layer 136, for instance, to facilitate selectively implanting a source and drain dopant within the exposed first region 134 of fin(s). This protective layer 136 protects the structure of second region 134' from ion implantation processing to be subsequently performed within the first region 134. In one embodiment, protective layer 136 may include or be fabricated of a nitride material or an oxide material, such as, for instance, silicon nitride or silicon oxide, or an oxynitride or a combination thereof. The deposition processes may include any conventional process such as, for example, low temperature CVD, PECVD, or ALD. In one specific example, silicon nitride may be deposited using process gases such as, for example, dichlorosilane ($SiH_2Cl_2$) and ammonia ($NH_3$) and using known process conditions. In a further example, a low-pressure CVD or ALD-created mask may be used to form the protective layer. In another example, other hard mask materials, such as metal oxides or metals, may be used.

Continuing with FIG. 1J, first region 134 of fin(s) 104, and in particular, diffusion-suppressed region 114', may be implanted with a source and drain dopant to form a source and drain region 138 of n-type transistor (n-type FinFET). By way of example, the source and drain dopant may be or include an n-type dopant. As used herein, an n-type dopant refers to the addition of impurities to the first region 134 (comprising, for instance, an intrinsic semiconductor material), which contributes more electrons to the intrinsic material, and may include (for instance) phosphorus, antimony or arsenic. In one example, the first region 134 may be implanted with, for instance, an n-type active dopant such as, for instance, phosphorus or a compound of phosphorus (for instance, heptaphosphane ($P_7H_3$)), by employing an implantation dose of about 5e12 to 3e13 atom/$cm^2$, with an implantation energy of about 30 to 50 keV, to provide a desired concentration of n-type source and drain active dopant within fin(s) 104. In such an example, the concentration of n-type source and drain active dopants implanted within substrate 102 may be in the range of about 5e 18 to 3e19 atom/$cm^3$.

In one embodiment, first region 134 of fin(s) 104, and in particular, diffusion-suppressed region 114' of the first region 134, has been implanted with the active source and drain dopant via, for instance, an ion implantation process employing process parameters such as, for example, implantation energy and/or implantation dose, so as to facilitate implanting only a portion of the diffusion-suppressed region 114', as illustrated. Additionally, the implantation energy employed during the ion implantation process may be selected and configured to facilitate defining a depth of the active source and drain region within the diffusion-suppressed region 114'. For instance, the depth of the source and drain region 138, in one example, may be equal or substantially be less than a depth of the diffusion-suppressed region 114'. In another example, the source and drain region 138 within the fin material may have a desired depth relative to a depth of the diffusion-suppressed region 114' which may be being within a range of about 5 to 10%. As discussed above, the implantation energy of the diffusion-suppressing dopant may be substantially higher than the implantation energy of the source and drain dopant.

Figure 1K:
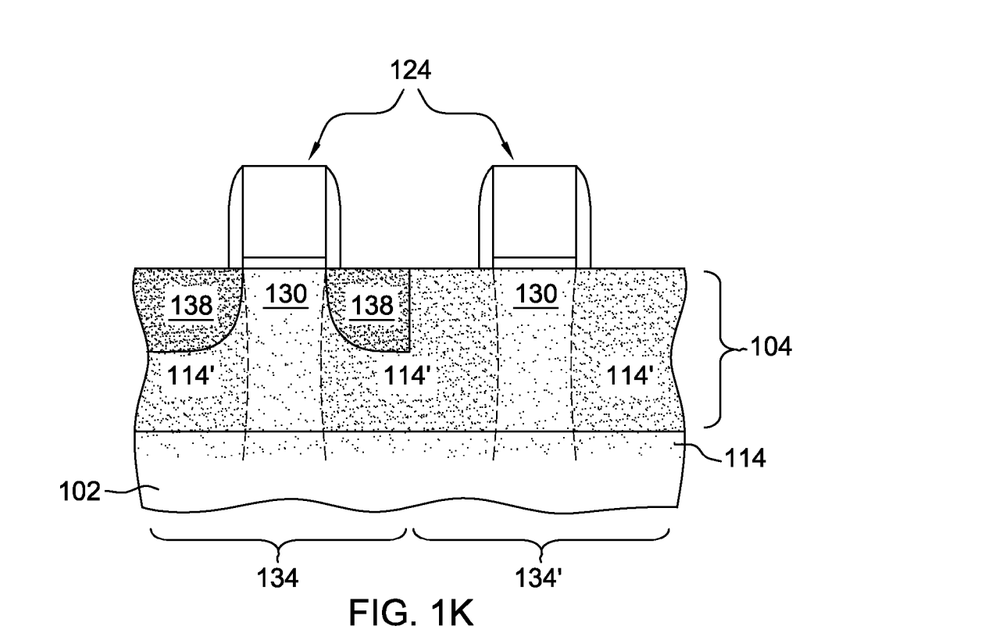
FIG. 1K depicts the structure of FIG. 1J, after removal of the protective layer, in accordance with one or more aspects of the present invention.

As depicted in FIG. 1K, protective layer 136 (see FIG. 1J) disposed over the second region 134' of the fin(s) may be removed, in accordance with one or more aspects of the present invention. The protective layer may be removed by any suitable etching process, such as anisotropic dry etching processing, for instance RIE.

Figure 1L:
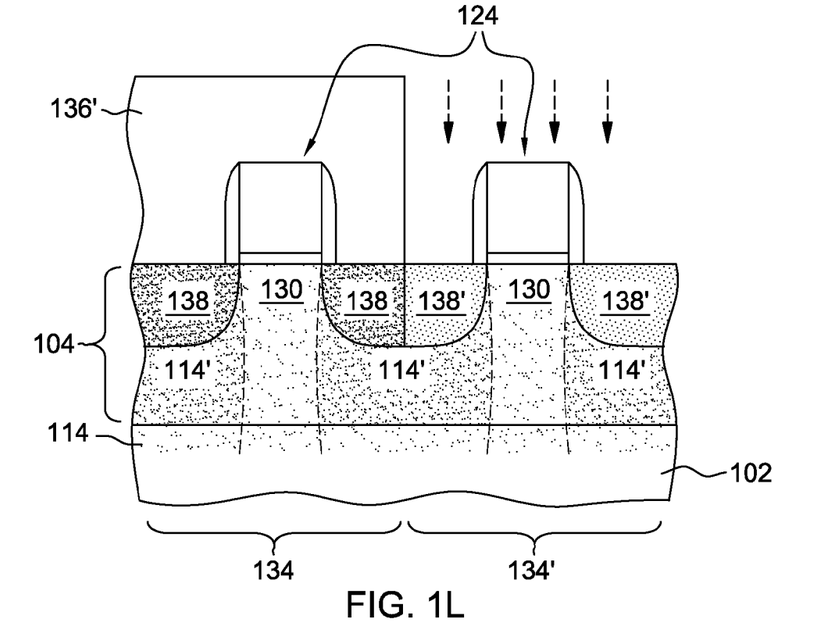
FIG. 1L depicts the structure of FIG. 1K, after providing a protective layer over a first region of the fin(s), and implanting a second active dopant thereof, in accordance with one or more aspects of the present invention.

FIG. 1L illustrates the structure of FIG. 1K with a further protective layer 136' having been provided over the first region 134' of fin(s) 104 to, for instance, facilitate selectively implanting source and drain active dopant within the second region 134' of the fin(s). Additional protective layer 136' may be provided using any of the techniques described above with regard to the protective layer 136 (FIG. 1J) provided over the second region 134'. In another example, and depending on the process steps involved, second region 134' may be implanted simultaneously with the first region 134, obviating the need for a second implanting step using additional protective layer 136'.

Continuing with FIG. 1L, second region 134' of fin(s) 104, and in particular, diffusion-suppressed region 114', may be implanted with an active source and drain dopant to form a source and drain region 138' of p-type transistor (p-type FinFET). By way of example, the source and drain dopant may be or include p-type dopant. Note that as used herein, p-type dopant refers to the addition of an impurity to the second region 134' of fin(s) 104 (comprising, for instance, an intrinsic semiconductor material) to create deficiencies of valence electrons. Examples of a p-type dopant may include boron, aluminum, gallium or indium, any one or more of which may be added to second region 134' including, for instance, silicon fin material. In one example, the second region 134' may be implanted with, for instance, a p-type active dopant such as, for instance, boron or a compound of boron (for instance, boron trifluoride ($BF_3$), octadecaborane ($B_{18}H_{22}$)), by employing an implantation dose of about 5e12 to 3e13 atom/$cm^2$, with an implantation energy of about 10 to 15 keV, to provide a desired concentration of p-type active dopant within the second region 134' of fin(s) 104. In such an example, the concentration of p-type active dopants implanted within fin(s) 104 may be in the range of about 5e18 to 3e19 atom/$cm^3$.

As discussed above, second region 134' of fin(s) 104, and in particular, diffusion-suppressed region 114' of the second region 134', has been implanted with the active source and drain dopant via, for instance, an ion implantation process employing process parameters such as, for example, implantation energy and/or implantation dose, so as to facilitate implanting only a portion of the diffusion-suppressed region 114', as illustrated. Additionally, the implantation energy employed during the ion implantation process may be selected and configured to facilitate defining a depth of the active source and drain region within the diffusion-suppressed region 114'. For instance, the depth of the source and drain region 138', in one example, may be equal or substantially be less than a depth of the diffusion-suppressed region 114'. In another example, the source and drain active region 138' within the fin material has a desired depth relative to a depth of the diffusion-suppressed region 114' which may be being within a range of about 5 to 10%. Additionally, the depth of the source and drain region 138' may also equal or be substantially be less than the depth of the well active region and the first diffusion-suppressed region 114. Note also that, as discussed above, the implantation energy of the diffusion-suppressing dopant may be substantially higher than the implantation energy of the source and drain dopant.

Figure 1M:
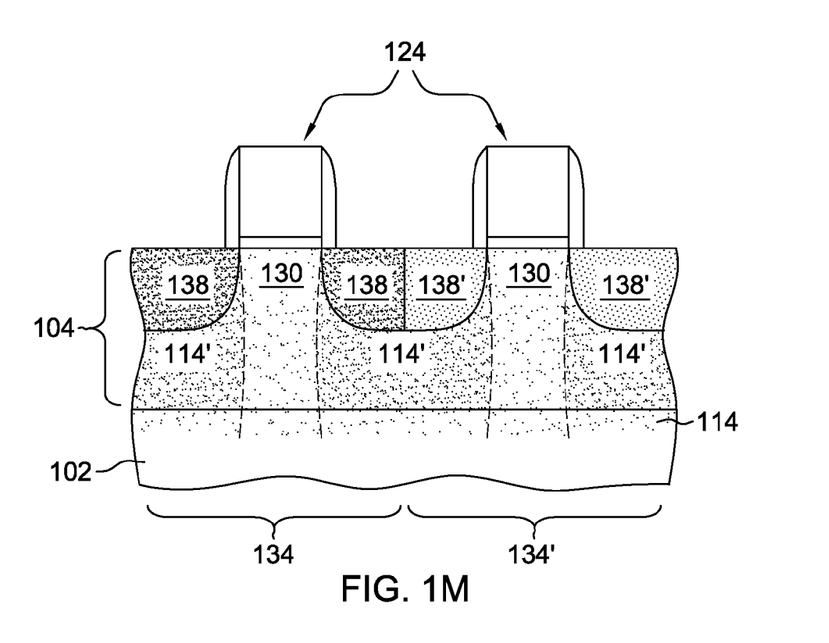
FIG. 1M depicts the structure of FIG. 1L, with one or more active source and drain regions having been established and subsequently, removing the protective layer from the first fin region thereof, in accordance with one or more aspects of the present invention.

As depicted in FIG. 1M, structure 100 may optionally be subjected to an annealing process to facilitate diffusing of the active source and drain dopant within the first region 134 and second region 134', to achieve a desired configuration and distribution of the active dopant within source and drain regions 138 and 138' of n-type fin-field-effect transistor (n-type FinFET) and p-type transistor such as, for instance, p-type fin-field-effect transistor (p-type FinFET), respectively. The crystal lattice structure of the silicon fin material, for instance, may be altered during the ion (i.e., active dopant) implantation process, resulting in the implanted active dopant being weakly bound to the silicon substrate material. Upon performing a high temperature annealing process, the crystal lattice structure of the substrate material may be adjusted to better position the active dopant into the crystal lattice structure of the substrate material, thereby stabilizing the active dopant within the silicon substrate material. The high temperature annealing process may be performed using, for instance, a spike annealing, laser annealing, rapid thermal annealing (RTA), flash annealing or the like. In one example, this annealing process may be performed using rapid thermal annealing process at an elevated temperature of about 950° C. to 1100° C. in the presence of inert gas such as, Argon (Ar), at about atmospheric pressure.

As discussed above, in another embodiment, the diffusion-suppressed dopant disposed within the diffusion-suppression region advantageously facilitates in minimizing or preventing undesirable distribution and/or diffusion of the n-type and p-type active source and drain dopants beyond the intended active source and drain regions during the ion implantation process. Additionally, the diffusion-suppressing dopant of the diffusion-suppressed region advantageously facilitates in minimizing or inhibiting lateral or longitudinal diffusion of the active source and drain dopants, for instance, beyond the diffusion-suppressed region. Note that this minimizing of the lateral diffusion (often referred to as lateral straggle) or longitudinal diffusion (also referred to as longitudinal straggle) advantageously facilitates controlling location of the active region(s), thereby suppressing transient-enhanced diffusion (TED) of the active dopants.

Continuing with FIG. 1M, protective layer 136' (see FIG. 1L) disposed over the first region 134 may be removed, in accordance with one or more aspects of the present invention. Additional protective layer 136' may be removed using any of the techniques described above with regard to the protective layer 136 (FIG. 1L), as discussed above in connection with FIG. 1K.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a semiconductor structure, the fabricating comprising:
        implanting a diffusion-suppressing dopant, under controlled temperature, into a semiconductor material of the semiconductor structure, wherein the implanting facilitates defining a diffusion-suppressed region within the semiconductor material and, wherein the implanting comprises implanting the diffusion-suppressing dopant at a controlled process temperature selected to facilitate minimizing interstitial defects within a crystal lattice structure of the semiconductor material; and
        establishing one or more active regions within the diffusion-suppressed region of the semiconductor structure, the establishing comprising implanting an active dopant into the semiconductor material, and wherein the implanting of the diffusion-suppressing dopant under controlled temperature facilitates inhibiting diffusion of the active dopant within the diffusion-suppressed region.

2. The method of claim 1, wherein the implanting further comprises, performing an annealing process, subsequent to the implanting of the diffusion-suppressing dopant into the semiconductor material, the annealing process facilitating stabilizing the diffusion-suppressed region within the semiconductor material.

3. The method of claim 1, wherein the implanting comprises implanting the diffusion-suppressing dopant with an implantation energy, while controlling a process temperature, which defines a depth of the diffusion-suppressed region at a desired depth within the semiconductor material.

4. The method of claim 1, wherein the establishing comprises establishing at least one of a well region, a punch-through stop region, a channel region or a source and drain region separated by the channel region within the semiconductor material.

5. The method of claim 4, wherein the fabricating comprises temperature-controllable implanting of the diffusion-suppressing dopant into the semiconductor material with a first implantation energy, and implanting the active dopant into the semiconductor material with a second implantation energy, the first implantation energy being higher than the second implantation energy.

6. The method of claim 1, wherein the diffusion-suppressing dopant comprises a first diffusion-suppressing dopant, and the one or more active regions comprises a channel region of the semiconductor structure, the channel region extending, at least partially, into a first diffusion-suppressed region within the semiconductor material of a substrate, and wherein the fabricating further comprises:
    providing a gate structure over the channel region of the semiconductor structure;
    implanting of a second diffusion-suppressing dopant under controlled temperature into the semiconductor material of a fin structure extending above the substrate, wherein the implanting facilitates defining a second diffused-suppressed region, the second diffused-suppressed region being outside of the channel region and extending, at least partially, into the first diffusion-suppressed region; and
    establishing a source and drain region within the second diffusion-suppressed region of the fin structure.

7. The method of claim 1, wherein the channel region of the semiconductor structure includes a channel dopant material, and wherein the establishing the source and drain region comprises implanting a source and drain dopant material into the semiconductor material, the channel dopant material and the source and drain dopant material being different dopant materials.

8. The method of claim 1, wherein the diffusion-suppressing dopant comprises a first dopant material, and the active dopant comprises a second dopant material, the first dopant material and the second dopant material being different dopant materials.

9. The method of claim 8, wherein the first dopant material comprises at least one of germanium, carbon, fluorine or nitrogen, and the second dopant material comprises at least one of an n-type dopant or a p-type dopant.

10. A method comprising:
    fabricating a fin-type field-effect transistor (FinFET), the fabricating comprising:
        implanting a diffusion-suppressing dopant under controlled temperature into a semiconductor material of the FinFET, wherein the implanting of the diffusion-suppressing dopant facilitates defining a diffusion-suppressed region within the semiconductor material;
        establishing one or more active regions within the diffusion-suppressed region of the FinFET, the establishing comprising implanting an active dopant into the semiconductor material, and wherein the implanting of the diffusion-suppressing dopant under controlled temperature facilitates inhibiting diffusion of the active dopant within the diffusion-suppressed region of the FinFET; and
    wherein the diffusion-suppressing dopant comprises a first diffusion-suppressing dopant and a second diffusion-suppressing dopant, and the implanting comprises implanting the first diffusion-suppressing dopant under controlled temperature into a substrate of the FinFET, and the method further comprises implanting the second diffusion-suppressing dopant under controlled temperature into a fin structure extending above substrate of the FinFET.

11. The method of claim 10, wherein the FinFET comprises an n-type FinFET and a p-type FinFET, and wherein the method further comprises:

non-selectively implanting the diffusion-suppressing dopant under controlled temperature into the semiconductor material of the n-type FinFET and the p-type FinFET, wherein the non-selectively implanting facilitates defining the diffusion-suppressed region within the semiconductor material; and subsequent to the non-selectively implanting, establishing one or more active regions by selectively implanting the active dopant into the semiconductor material, wherein the selectively implanting of the active dopant facilitates forming of the n-type FinFET and the p-type FinFET.

12. A method comprising:

fabricating a fin-type field-effect transistor (FinFET), the fabricating comprising:

implanting a diffusion-suppressing dopant under controlled temperature into a semiconductor material of the FinFET, wherein the implanting of the diffusion-suppressing dopant facilitates defining a diffusion-suppressed region within the semiconductor material;

establishing one or more active regions within the diffusion-suppressed region of the FinFET, the establishing comprising implanting an active dopant into the semiconductor material, and wherein the implanting of the diffusion-suppressing dopant under controlled temperature facilitates inhibiting diffusion of the active dopant within the diffusion-suppressed region of the FinFET; and wherein the FinFET comprises an n-type FinFET and a p-type FinFET, and wherein the method further comprises:

non-selectively implanting the diffusion-suppressing dopant under controlled temperature into the semiconductor material of the n-type FinFET and the p-type FinFET, wherein the non-selectively implanting facilitates defining the diffusion-suppressed region within the semiconductor material; and subsequent to the non-selectively implanting, establishing one or more active regions by selectively implanting the active dopant into the semiconductor material, wherein the selectively implanting of the active dopant facilitates forming of the n-type FinFET and the p-type FinFET.

* * * * *